US010381417B2

(12) United States Patent
Kajiyama et al.

(10) Patent No.: US 10,381,417 B2
(45) Date of Patent: Aug. 13, 2019

(54) WHITE LIGHT-EMITTING DEVICE

(71) Applicant: V Technology Co., LTd., Yokohama-shi (JP)

(72) Inventors: Koichi Kajiyama, Yokohama (JP); Michinobu Mizumura, Yokohama (JP); Yuya Fujimori, Yokohama (JP)

(73) Assignee: V. Technology Co., Ltd., Yokohama (JP)

(*) Notice: Subject to any disclaimer, the term of this patent is extended or adjusted under 35 U.S.C. 154(b) by 0 days.

(21) Appl. No.: 15/570,871

(22) PCT Filed: Jun. 6, 2016

(86) PCT No.: PCT/JP2016/066733
§ 371 (c)(1),
(2) Date: Oct. 31, 2017

(87) PCT Pub. No.: WO2016/204007
PCT Pub. Date: Dec. 22, 2016

(65) Prior Publication Data

US 2018/0166505 A1 Jun. 14, 2018

(30) Foreign Application Priority Data

Jun. 16, 2015 (JP) ................................ 2015-121503
Jul. 16, 2015 (JP) ................................ 2015-141824

(51) Int. Cl.
*H01L 27/32* (2006.01)
*G02B 5/20* (2006.01)
(Continued)

(52) U.S. Cl.
CPC ........... *H01L 27/322* (2013.01); *G02B 5/201* (2013.01); *G09G 3/006* (2013.01); *G09G 5/02* (2013.01);
(Continued)

(58) Field of Classification Search
None
See application file for complete search history.

(56) References Cited

U.S. PATENT DOCUMENTS

2002/0154257 A1* 10/2002 Iijima ............... G02F 1/133514 349/67
2004/0174389 A1* 9/2004 Ben-David .......... G09G 3/3413 345/694
(Continued)

FOREIGN PATENT DOCUMENTS

JP 2003-178875 A 6/2003
JP 2006-059775 A 3/2006
(Continued)

OTHER PUBLICATIONS

First Office Action dated Dec. 4, 2018, of counterpart Chinese Application No. 201680025235.3, including an English translation.
(Continued)

*Primary Examiner* — Herve-Louis Y Assouman
(74) *Attorney, Agent, or Firm* — DLA Piper LLP (US)

(57) ABSTRACT

A white light-emitting device is capable of correcting deviations in chromaticity and includes a plurality of pixels, each of the plurality of pixels includes at least two sub-pixels, and each of the sub-pixels is a white light-emitting element. At least one sub-pixel out of the at least two sub-pixels includes a color filter. The optical characteristic of the color filter is set to correct the deviation of chromaticity of light emitted by the white light-emitting element. The white light-emitting device further controls an emission intensity of each of the white light-emitting elements.

11 Claims, 10 Drawing Sheets

(51) Int. Cl.

| | |
|---|---|
| ***G09G 5/02*** | (2006.01) |
| ***G09G 3/00*** | (2006.01) |
| *G06F 3/14* | (2006.01) |

(52) U.S. Cl.

CPC ........ *H01L 27/3211* (2013.01); *G06F 3/1446* (2013.01); *G09G 2320/0242* (2013.01); *G09G 2320/0693* (2013.01); *G09G 2330/023* (2013.01); *G09G 2380/08* (2013.01)

(56) References Cited

U.S. PATENT DOCUMENTS

| | | | | | |
|---|---|---|---|---|---|
| 2006/0038953 | A1* | 2/2006 | Moriya | G02F 1/133514 | 349/144 |
| 2012/0025699 | A1* | 2/2012 | Okumoto | H01L 51/5284 | 313/506 |
| 2012/0133871 | A1* | 5/2012 | Saigusa | G02B 5/3083 | 349/108 |
| 2013/0285537 | A1* | 10/2013 | Chaji | H01L 27/322 | 313/504 |

FOREIGN PATENT DOCUMENTS

| | | | |
|---|---|---|---|
| JP | 2011-119224 | A | 6/2011 |
| JP | 2014-078037 | A | 5/2014 |
| JP | 2014-154226 | A | 8/2014 |

OTHER PUBLICATIONS

Notification of Reasons for Refusal dated Apr. 5, 2019, of counterpart Japanese Application No. 2015-141824, in English.

* cited by examiner

FIG. 3

| COLOR FILTER TYPE | TRANSMITTANCE | | | USAGE EFFICIENCY |
|---|---|---|---|---|
| | RED LIGHT | GREEN LIGHT | BLUE LIGHT | |
| FIRST COLOR FILTER | 100% | 70% | 70% | 80% |
| SECOND COLOR FILTER | 70% | 100% | 70% | 80% |
| THIRD COLOR FILTER | 70% | 70% | 100% | 80% |
| | | OVERALL USAGE EFFICIENCY | | 80% |

FIG. 6

| COLOR FILTER TYPE | TRANSMITTANCE | | | USAGE EFFICIENCY |
|---|---|---|---|---|
| | RED LIGHT | GREEN LIGHT | BLUE LIGHT | |
| FIRST COLOR FILTER | 0% | 100% | 100% | 67% |
| SECOND COLOR FILTER | 100% | 0% | 100% | 67% |
| THIRD COLOR FILTER | 100% | 100% | 0% | 67% |
| | | OVERALL USAGE EFFICIENCY | | 67% |

FIG. 9

| COLOR FILTER TYPE | TRANSMITTANCE | | | USAGE EFFICIENCY | AREA |
|---|---|---|---|---|---|
| | RED LIGHT | GREEN LIGHT | BLUE LIGHT | | |
| COLOR FILTER NOT INCLUDED | 100% | 100% | 100% | 100% | 80% |
| THIRD COLOR FILTER | 0% | 0% | 100% | 33% | 20% |
| | | | OVERALL USAGE EFFICIENCY | | 87% |

WHITE LIGHT-EMITTING DEVICE

TECHNICAL FIELD

This disclosure relates to a white light-emitting device.

BACKGROUND

Various elements that emit white light such as a white light-emitting organic electro-luminescence (EL) or a white light emitting diode (LED) have been proposed as a light source of a monitor or the like, or a light source for lighting.

In those white light-emitting elements, deviations may occur between the colors of light beams emitted from different elements, or deviations in color of emitted light may occur due to changes in the elements over time. Therefore, when the element is used as a light source for a monitor or a lighting, color unevenness in emitted light, rotation of hue or the like occurs due to the element.

It could therefore be helpful to provide a white light-emitting device capable of correcting deviations in chromaticity.

SUMMARY

We thus provide:

A white light-emitting device including a plurality of pixels. Each of the plurality of pixels includes at least two sub-pixels, each of the sub-pixels is a white light-emitting element, and at least one sub-pixel out of the at least two sub-pixels includes a color filter. The optical characteristic of the color filter is set to correct deviations in chromaticity of light emitted by the white light-emitting element, and the white light-emitting device further includes a light emission control unit that controls an emission intensity of each white light-emitting element.

Deviations in chromaticity of the white light-emitting element may be deviations in chromaticity due to change over time of the white light-emitting element.

Each of the plurality of pixels includes at least three sub-pixels, and respective sub-pixels include color filters having different optical characteristics. Each color filter included in each sub-pixel may have a transmittance of 50% or more, with respect to at least two light beams out of red light, green light, and blue light.

The color filter may have an optical characteristic of transmitting light at a position symmetrical to a point on a trajectory of change over time in the chromaticity of the light emitted by the white light-emitting element, the trajectory being plotted on a Commission Internationale de l'Eclairage (CIE) chromaticity diagram, with respect to white color on the chromaticity diagram.

Each of the plurality of pixels includes two sub-pixels, and one of the two sub-pixels may include a color filter. The area of a sub-pixel with a color filter may be smaller than the area of a sub-pixel without a color filter.

The optical characteristic of the color filter may be set to cancel deviations between the chromaticity of the light emitted by the white light-emitting element included in the white light-emitting device and the chromaticity of the light emitted by the white light-emitting element included in another white light-emitting device different from the white light-emitting device.

The white light-emitting element may be a white light-emitting organic EL.

Further, any combination of the above constituent elements and converted forms among a method, an apparatus, a system, and the like are also effective.

It is thus possible to provide a white light-emitting device capable of correcting deviations in chromaticity.

BRIEF DESCRIPTION OF THE DRAWINGS

FIG. 3 is a diagram showing optical characteristics of a color filter according to the example in tabular form.

FIG. 6 is a diagram showing optical characteristics of a color filter according to a first modification example in tabular form.

FIG. 9 is a diagram showing the optical characteristics of the color filter according to the second modification example in tabular form.

REFERENCE SIGNS LIST

100 WHITE LIGHT-EMITTING DEVICE
110 DISPLAY
112 PIXEL
114 SUB-PIXEL
114*a* FIRST SUB-PIXEL
114*b* SECOND SUB-PIXEL
114*c* THIRD SUB-PIXEL
116 COLOR FILTER
116*a* FIRST COLOR FILTER
116*b* SECOND COLOR FILTER
116*c* THIRD COLOR FILTER
120 LIGHT EMISSION CONTROL UNIT

DETAILED DESCRIPTION

An overview of example will be described. A white light-emitting device according to an example includes a light emitting surface configured with a plurality of pixels, and includes a white light-emitting element for each pixel. In the light emitting element that emits white light, the chromaticity may deviate due to changes over time. In addition, deviations in chromaticity may also occur between white light-emitting elements due to manufacturing error or the like. Therefore, in the white light-emitting device according to the example, each pixel is configured with two or more sub-pixels and a white light-emitting element is disposed in each sub-pixel. Further, at least one sub-pixel out of two or more sub-pixels constituting each pixel includes a color filter to correct the deviation in chromaticity described above.

The white light-emitting device according to the example is configured such that the light emission luminance of the white light-emitting element for each sub-pixel can be individually adjusted. Thus, by adjusting the light emission luminance of the white light-emitting element for a sub-pixel including the color filter, it is possible to correct the overall deviation in the chromaticity of the white light-emitting device.

Further, the white light-emitting device according to the example is a device intended to emit light of "white color." Therefore, the color filter may correct deviations in chromaticity due to change over time of the light emitting element, and deviations in chromaticity due to manufacturing errors. Therefore, the color filter for chromaticity correction needs not be a color filter of a primary color (for example, a filter that transmits substantially only red light, green light, and blue light) as used in, for example, a general color monitor. That is, even if a filter having lower color purity and higher light transmittance as compared to a primary color filter is used, the above-described deviations in chromaticity can be corrected. Therefore, the white light-emitting device according to the example can also increase the power efficiency of the white light-emitting element, thereby extending the service life of the white light-emitting element as a result.

Hereinafter, the white light-emitting device according to the example will be described in more detail with reference to the drawings. In the following, for example, numerical values of the usage efficiency and the like are specifically shown, but these values are only examples and are not limited thereto. Specific values such as numerical values may be determined experimentally according to the purpose of the white light-emitting device and the like.

Figure 1:
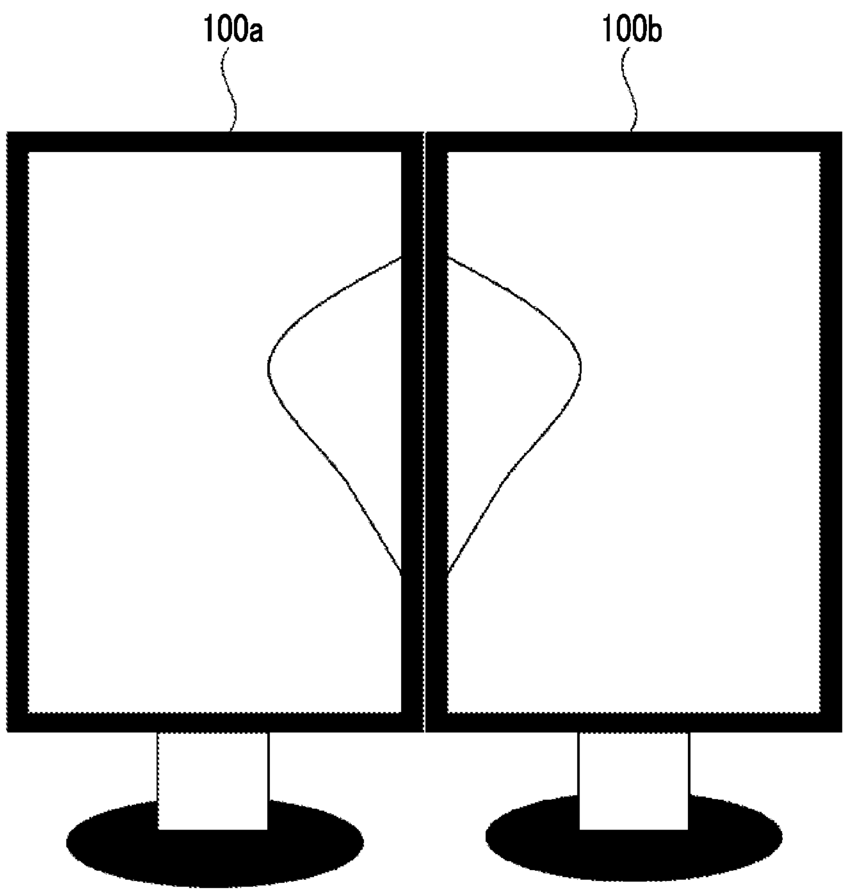
FIG. 1 is a diagram showing an example of a white light-emitting device.

FIG. 1 is a diagram showing an example of a white light-emitting device 100 according to an example. FIG. 1 shows an example in which two white light-emitting devices (the first white light-emitting device 100*a* and the second white light-emitting device 100*b*) are simultaneously used. Hereinafter, except for distinguishing between the first white light-emitting device 100*a* and the second white light-emitting device 100*b*, they are simply described as "white light-emitting device 100."

In the example shown in FIG. 1, the white light-emitting device 100 is a monitor for medical use, more specifically, it is a monitor to read X-ray images. The display object of the white light-emitting device 100 is a digitized X-ray transmission image of a human body, which is a grayscale image. Therefore, the white light-emitting device 100 is also a monitor for grayscale display. FIG. 1 shows an example in reading a mammogram in particular. In the following description, the white light-emitting device 100 will be described on the premise that it is a medical grayscale monitor. However, it will be understood by those skilled in the art that the example can also be applied to devices other than grayscale monitors such as lighting devices.

Figure 2:
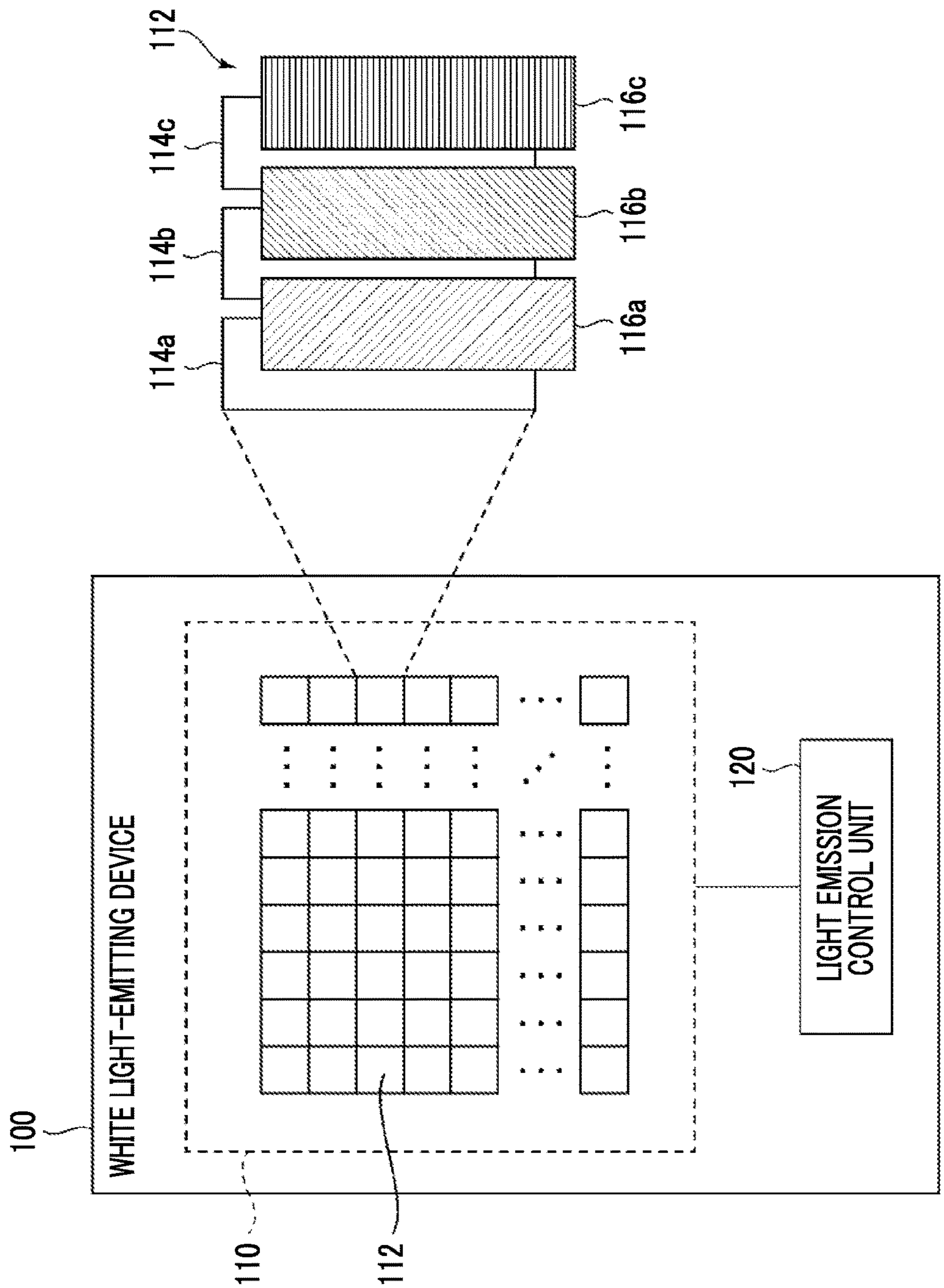
FIG. 2 is a diagram schematically showing the configuration of the example of the white light-emitting device.

FIG. 2 is a diagram schematically showing the configuration of the white light-emitting device 100 according to the example. The white light-emitting device 100 according to the example includes a display 110 and a light emission control unit 120.

The display 110 includes a plurality of pixels 112. In FIG. 2, to avoid complication, the reference numeral 112 is attached to only one pixel. However, in FIG. 2, rectangles with the same shape as the rectangle with the reference numeral 112 inside the display 110 indicate the pixels 112. Each pixel 112 includes at least two sub-pixels 114. In the example shown in FIG. 2, each pixel 112 includes three sub-pixels: a first sub-pixel 114*a*, a second sub-pixel 114*b*, and a third sub-pixel 114*c*. Hereinafter, the first sub-pixel 114*a*, the second sub-pixel 114*b*, and the third sub-pixel 114*c* are collectively referred to as "sub-pixel 114" unless they are distinguished.

Each sub-pixel 114 is a white light-emitting element capable of emitting white light. The white light-emitting element can be realized by a known light-emitting element such as a white light-emitting organic EL and a white LED. The light emission control unit 120 controls the emission intensity of each of the white light-emitting elements.

At least one sub-pixel 114 out of the sub-pixels 114 includes a color filter 116. FIG. 2 shows an example of when the first sub-pixel 114*a*, the second sub-pixel 114*b*, and the third sub-pixel 114*c* respectively include a first color filter 116*a*, a second color filter 116*b*, and a third color filter 116*c*.

As described above, the white light-emitting device 100 according to the example is a display device that displays a grayscale image. Therefore, the color filter 116 is not a filter intended to display a color image. The color filter according to the example has an optical characteristic set to suppress deviations in chromaticity of the light emitted by the white light-emitting element which is a sub-pixel. Each color filter 116 may not be a filter for generating light of so-called primary colors (red, green, and blue). If the deviations in chromaticity of the light emitted by the white light-emitting element can be suppressed, the color purity of the transmitted light may be low. Hereinafter, the color filter 116 used by the white light-emitting device 100 according to the example will be described in more detail.

FIG. 3 is a diagram showing optical characteristics of the color filter 116 according to the example in tabular form. In the example shown in FIG. 3, the first color filter 116*a* transmits 100% of red light. The first color filter 116*a* further transmits 70% of green light and blue light, respectively. As a result, when the white light is transmitted through the first color filter 116*a*, it becomes red light with low saturation. The second color filter 116*b* transmits 100% of the green light and transmits 70% of the red light and the blue light, respectively. Therefore, when the white light is transmitted through the second color filter 116*b*, it becomes green light with low saturation. The third color filter 116*c* transmits 100% of the blue light and transmits 70% of the red light and the green light, respectively. Therefore, when the white light is transmitted through the third color filter 116*c*, it becomes blue light with low saturation.

Figure 4:
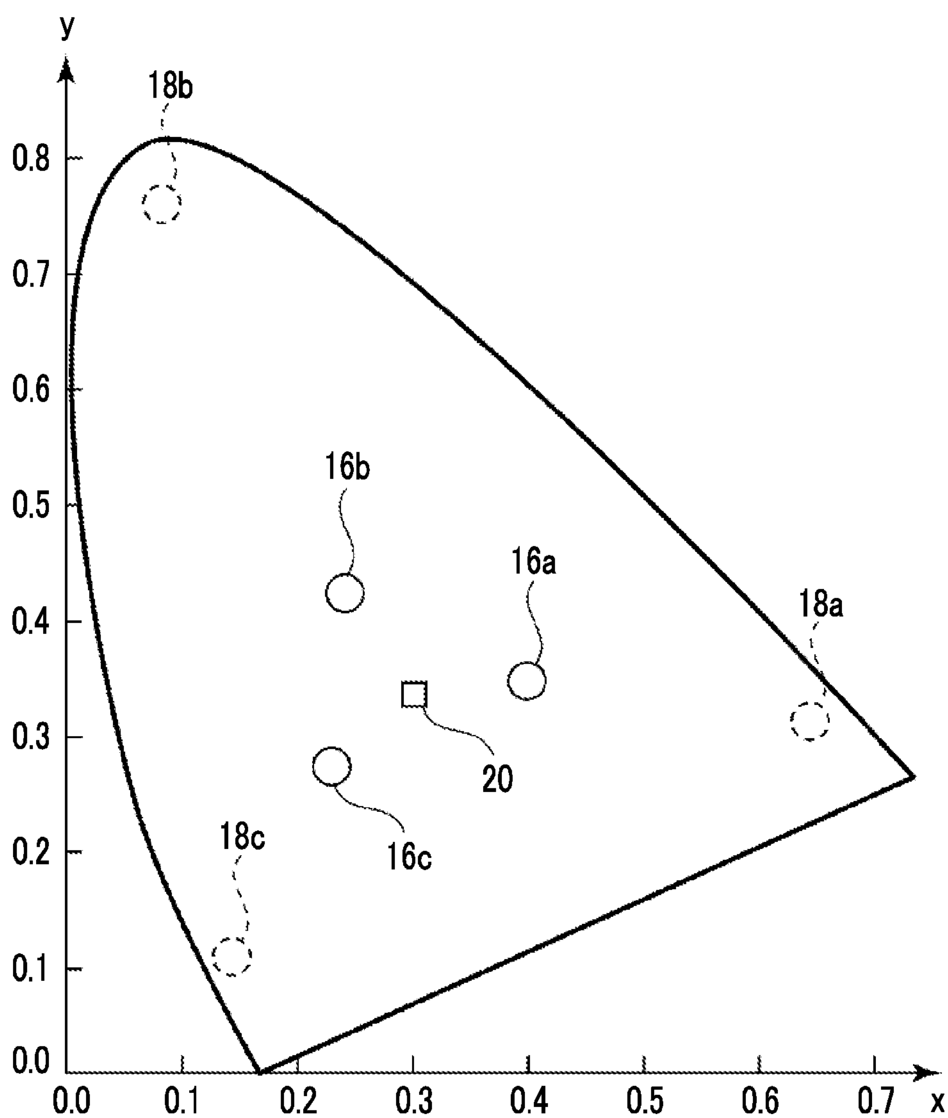
FIG. 4 is a diagram showing the optical characteristics of the color filter according to the example on a CIE chromaticity diagram.

FIG. 4 is a diagram showing the optical characteristics of the color filter 116 according to the example on a CIE chromaticity diagram. In FIG. 4, circles denoted by reference numerals 16*a*, 16*b*, and 16*c* respectively indicate the chromaticity of light transmitted through a first color filter 116*a*, a second color filter 116*b*, and a third color filter 116*c*. FIG. 4 also shows the optical characteristic of the color filter used in the color monitor in the related art, as a comparative example. Specifically, a first broken line circle 18*a* indicates the chromaticity of the light transmitted by a red filter in the related art, a second broken line circle 18*b* indicates the chromaticity of the light transmitted by a green filter in the related art, and a third broken line circle 18*c* indicates the chromaticity of the light transmitted by a blue filter in the related art. In FIG. 4, the rectangle 20 indicates the chromaticity of white light.

As is clear from FIG. 4, in the color filter 116 according to the example, the transmitted light is close to white light, as compared to the color filter used in the color monitor in the related art. That is, this means that the color filter 116 according to the example has higher light transmittance (light usage efficiency) of the light as compared to the color filter used in the color monitor in the related art.

As shown in FIG. 3, the usage efficiency of the color filter 116 according to the example is 80%. Therefore, the overall usage efficiency is also 80%. On the other hand, the usage efficiency of the color filter used in the color monitor in the related art is about 30%. As described above, since the color filter 116 according to the example has higher light usage efficiency, it is possible to suppress the power required to emit the light of the same luminance and improve the power efficiency as a result.

On the other hand, the color filter 116 according to the example has a narrower range of chromaticity of light that can be emitted, as compared to the color filter used in the color monitor in the related art. Specifically, when using the color filter used in the color monitor in the related art, the light having the chromaticity within the range of a triangle with the first broken line circle 18*a*, the second broken line circle 18*b*, and the third broken line circle 18*c* in FIG. 4 as corners can be reproduced. On the other hand, the chromaticity of the light that can be reproduced by the color filter 116 according to the example is within the range of a triangle with three circles shown by the solid line in FIG. 4 as corners.

As described above, in the white light-emitting device 100 according to the example, the light usage efficiency is improved, in exchange for narrowing the chromaticity of reproducible light. However, since the white light-emitting device 100 according to the example is not intended to present a full-color image, it does not matter that the chromaticity of the reproducible light is narrower than that of a color filter used in the color monitor of the related art. Hereinafter, the adjustment target of the white light-emitting device 100 according to the example, that is, the optical characteristics set in the color filter 116 will be described.

The optical characteristic of the color filter 116 according to the example is set to suppress the deviations in chromaticity of the white light-emitting element. Here, "deviation(s) in chromaticity of a white light-emitting element" includes at least deviations in chromaticity due to change over time of the white light-emitting element. The "deviation(s) in chromaticity of a white light-emitting element" may further include the deviations between the chromaticity of the light emitted by a white light-emitting element included in a white light-emitting device 100 and the chromaticity of the light emitted by a white light-emitting element included in another white light-emitting device 100 different from the white light-emitting device 100.

Figure 5:
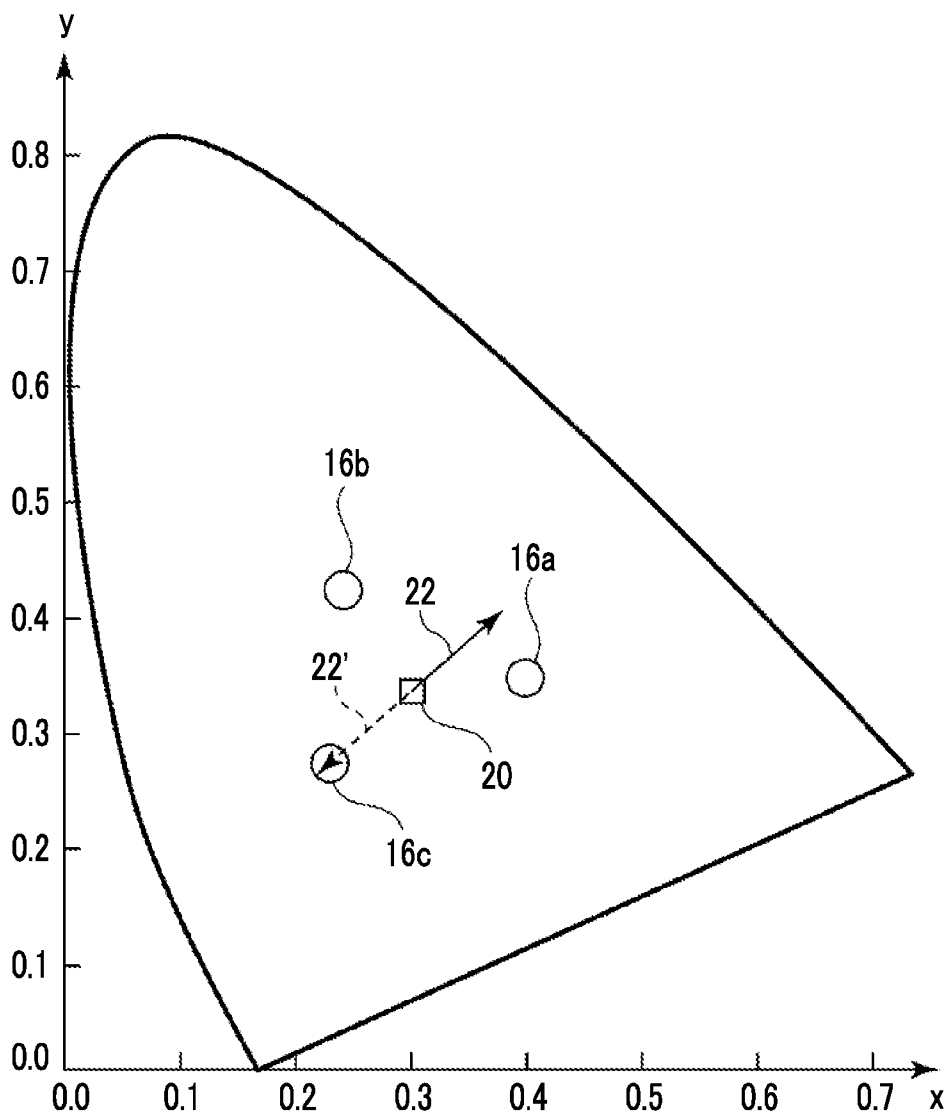
FIG. 5 is a schematic diagram explaining an example of the optical characteristics of the color filter according to the example.

FIG. 5 is a schematic diagram explaining the optical characteristics of the color filter 116 according to an example. More specifically, FIG. 5 is a diagram showing the tendency of the change over time of the chromaticity of the light emitted by the white light-emitting organic EL device on the CIE chromaticity diagram.

When the white light-emitting device 100 according to the example uses a white light-emitting organic EL element as a light source, it is known that the chromaticity of the light to be emitted changes over time. The white light-emitting organic EL element is made by mixing dopants that emit blue, green, and red lights, but their emission lifetimes differ depending on color. In particular, it is known that the emission lifetime of a dopant that emits blue light is shorter than the emission lifetimes of dopants that emit lights of other colors. Therefore, the emission amount of the blue light decreases as the emission time of the white light-emitting organic EL element increases. As a result, the trajectory drawn by the change over time of the chromaticity of the light emitted by the white light-emitting organic EL element is toward yellow in the CIE chromaticity diagram as shown by the arrow 22 in FIG. 5.

Therefore, the third color filter 116*c* has optical characteristics of transmitting light at position symmetrical to a point on a trajectory 22 of change over time of the chromaticity of the light emitted by the white light-emitting organic EL element, the trajectory 22 being plotted on a CIE chromaticity diagram, with respect to the chromaticity of the white light on the chromaticity diagram. In FIG. 5, the arrow 22' indicated by the broken line is the point symmetry of the trajectory 22 with respect to the chromaticity of the white light on the chromaticity diagram. The chromaticity of the light transmitted by the third color filter 116*c* overlaps the arrow 22'. Accordingly, the white light-emitting device 100 according to the example increases the amount of light to be transmitted through the third color filter 116*c* according to the deviation caused by the change over time of the chromaticity of the white light-emitting element, thereby correcting the deviation in chromaticity.

Further, the trajectory drawing the change over time of the chromaticity of light emitted by the white light-emitting organic EL element shown in FIG. 5 schematically shows an example. The trajectory may be determined by experimentally specifying the properties of the white light-emitting element actually used by the white light-emitting device 100.

The operation of the white light-emitting device 100 with the above configuration is as follows.

When the user continues to use the white light emitting device 100 and a change appears in color development of the white light-emitting device 100, the light emission control unit 120 performs control such that the light emission amount of the sub-pixel including the third color filter 116*c* increases. The third color filter 116*c* is designed to have optical characteristics that transmits light in a direction that cancels the change when color development changes by continuing to use the white light-emitting device 100. Therefore, it is possible to correct the deviation in chromaticity of the light emitted by the white light-emitting element.

When screening mammography result, two different monitors may be arranged to respectively display left and right breast images. In such a case, if one of the monitors changes in chromaticity due to change over time of the white light-emitting element, it may be difficult for the radiologist to diagnose. In such a case, it is possible to reduce the chromaticity difference between monitors by making the above correction. As described above, the white light-emitting device 100 according to the example cancel the deviation between the chromaticity of the light emitted by the white light-emitting element included in itself and the chromaticity of the light emitted by the white light-emitting element included in another white light-emitting device 100 different from the white light-emitting device 100. The deviation in color tones between the white light-emitting devices 100 may be not only deviation due to change over time of the white light-emitting elements but also deviation caused by manufacturing the white light-emitting devices.

As described above, according to the white light-emitting device 100 according to the example, it is possible to correct the deviation in chromaticity of the light emitted by the white light-emitting element.

In particular, the white light-emitting device 100 according to the example includes a color filter 116 to correct the change over time of the chromaticity of the light emitted by the white light-emitting element, and thus it is possible to correct the change over time of the chromaticity of the light emitted by the white light-emitting element. Further, the transmittance of light of the color filter 116 is larger than the transmittance of the color filter used in the color monitor in the related art. Therefore, it is possible to suppress the power required to emit light of the same luminance and improve power efficiency.

The foregoing description is based on the examples. It is to be understood by those skilled in the art that the example is illustrative and various modification examples of a combination of each component and each processing process are possible, and such modification examples are also within the scope of this disclosure.

First Modification Example

The above describes when the color filter 116 transmits any one of red light, green light, and blue light. However, the color filter 116 may not transmit or substantially transmit any one of the red light, the green light, and the blue light.

FIG. 6 is a diagram showing the optical characteristics of the color filter of the color filter 116 according to the first type of examples in tabular form. In the example shown in FIG. 6, the first color filter 116*a* transmits 100% of the green light and the blue light, respectively, but does not transmit the red light. As a result, when white light is transmitted through the first color filter 116*a*, it becomes cyan light. The second color filter 116*b* transmits 100% of the red light and the blue light and blocks the green light. As a result, when the white light is transmitted through the second color filter 116*b*, it becomes magenta light. The third color filter 116*c* transmits 100% of the red light and the green light and blocks the blue light. When the white light is transmitted through the third color filter 116*c*, it becomes yellow light.

In the color filters 116 according to the first type of examples, the usage efficiency is 67%. Therefore, as compared to the color filter used in the color monitor in the related art, the light usage efficiency is higher.

Figure 7:
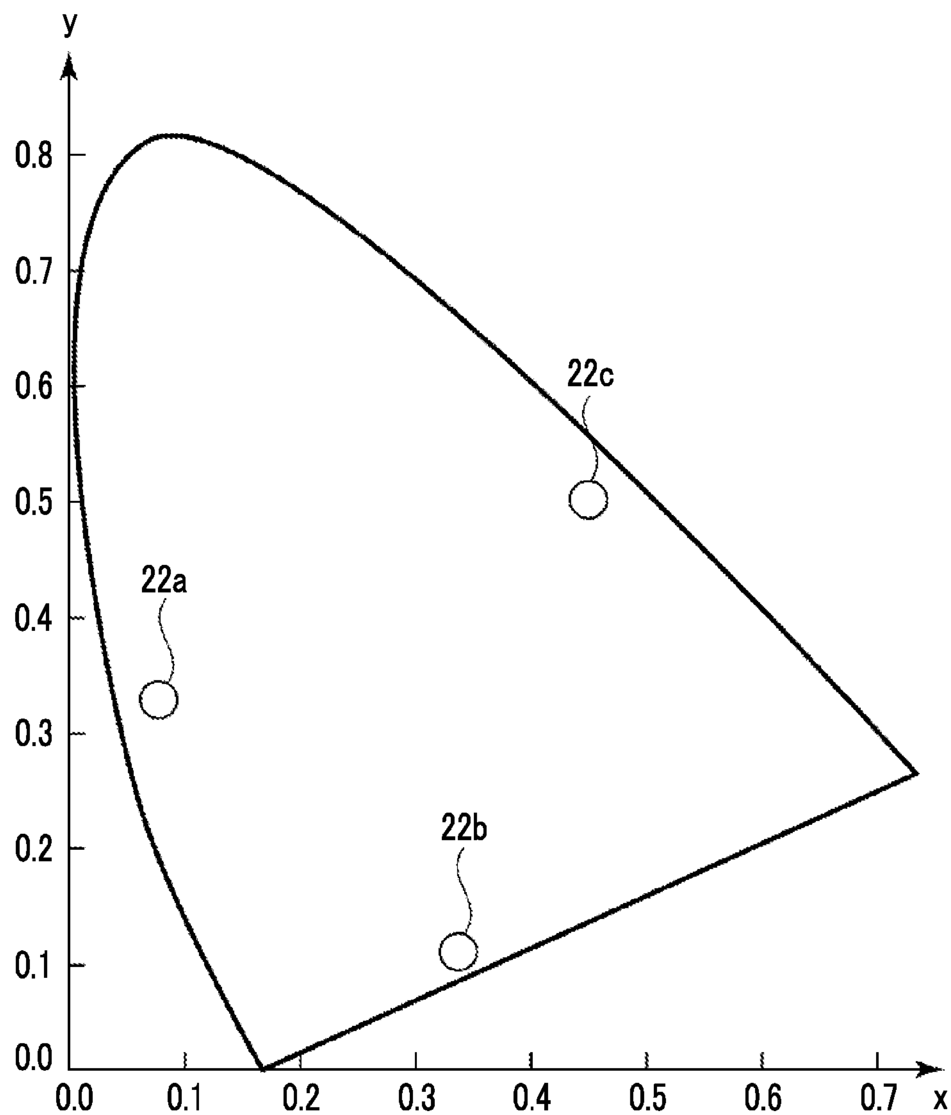
FIG. 7 is a diagram showing the optical characteristics of the color filter according to the first modification example on the CIE chromaticity diagram.

FIG. 7 is a diagram showing the optical characteristics of the color filter 116 according to the first modification example on the CIE chromaticity diagram. In FIG. 7, circles denoted by reference numerals 22*a*, 22*b*, and 22*c* respectively indicate the chromaticity of light transmitted through a first color filter 116*a*, a second color filter 116*b*, and a third color filter 116*c* according to the first modification example. As shown in FIG. 7, the range of the chromaticity of the light that can be reproduced by the color filter 116 according to the first modification example is wider than the range of the chromaticity of the light that can be reproduced by the color filter 116 according to the example shown in FIG. 4. Therefore, it is possible to correct larger deviations in color, by using the color filter 116 of the first modification example.

Second Modification Example

The above mainly describes when each pixel constituting the display 110 includes three sub-pixels. Alternatively, each pixel constituting the display 110 may include only two sub-pixels.

Figure 8:
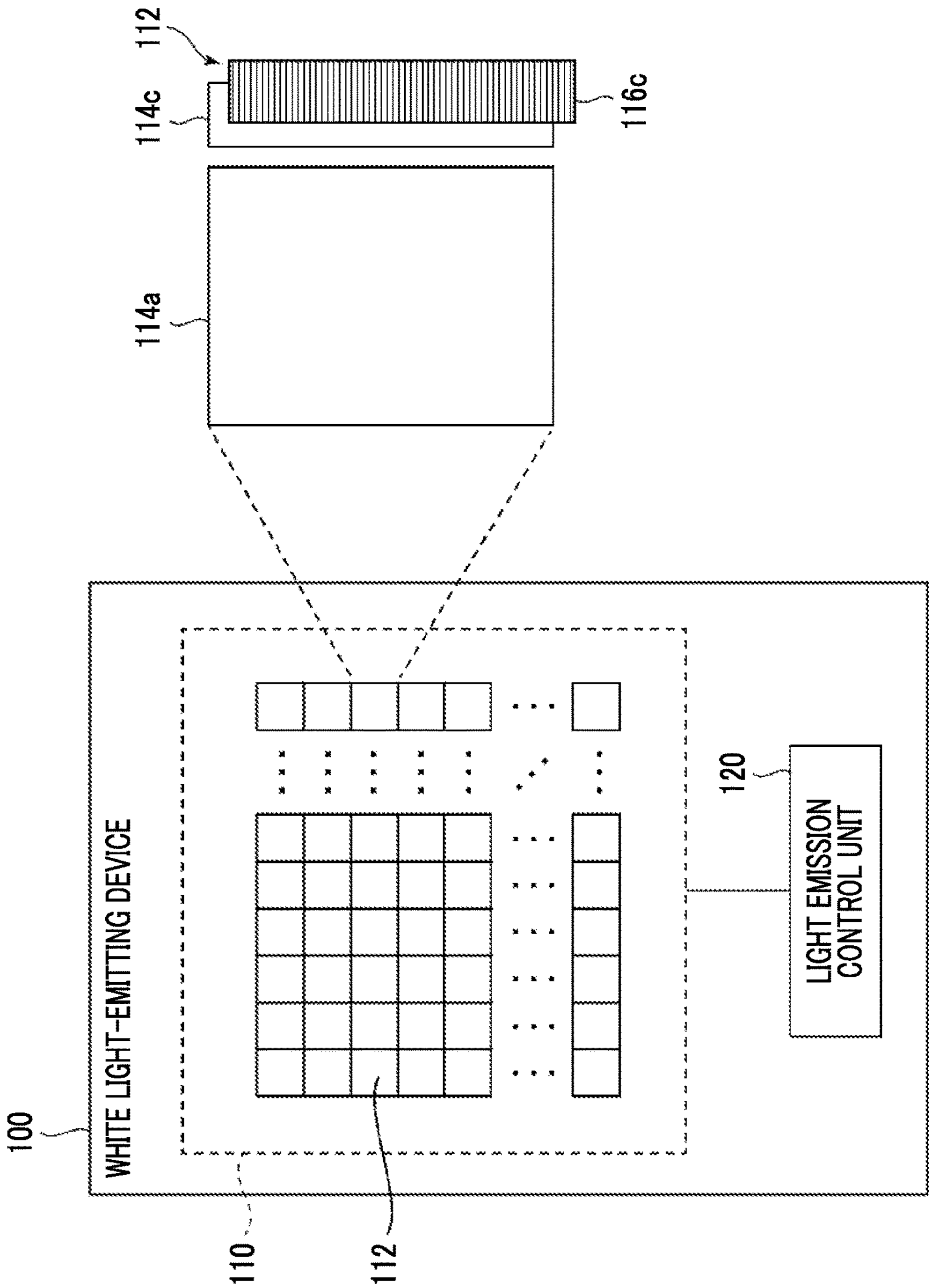
FIG. 8 is a diagram schematically showing the configuration of the white light-emitting device according to a second modification example.
Figure 10A:
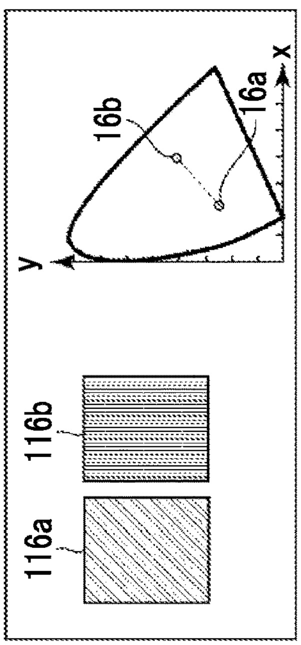
FIGS. 10(*a*) to (*f*) are schematic diagrams showing sub-pixels and color filters according to various modification examples.
Figure 10B:
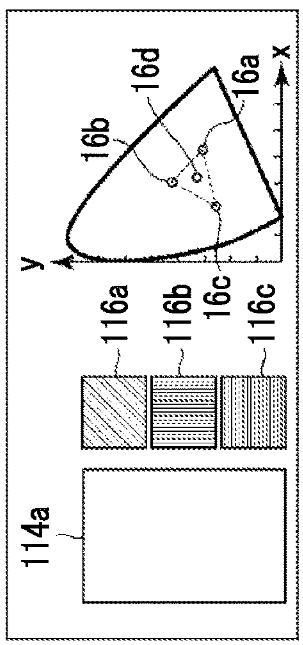
Figure 10C:
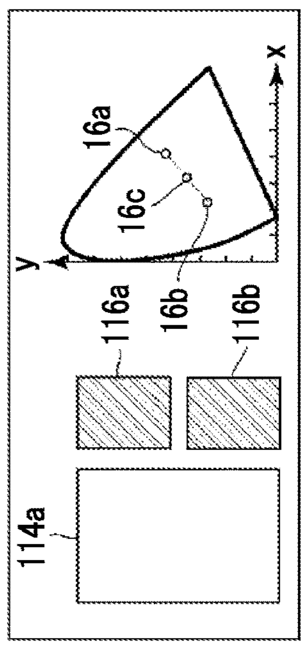
Figure 10D:
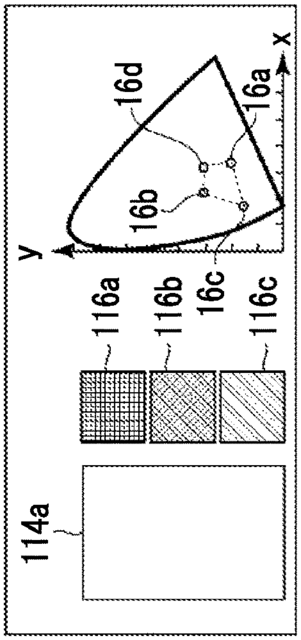
Figure 10E:
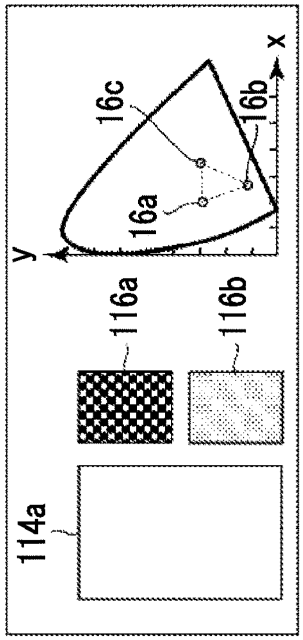
Figure 10F:
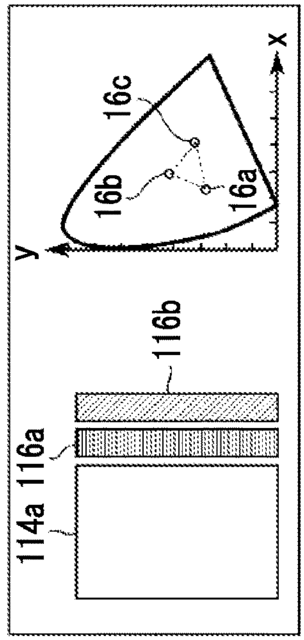

FIG. 8 is a schematic diagram showing the configuration of the white light-emitting device 100 according to the second modification example. The parts common to the white light-emitting device 100 according to the example described with reference to FIG. 3 will be described below by omitting or simplifying the parts as appropriate.

As shown in FIG. 8, in the white light-emitting device 100 according to the second modification example, each pixel has two sub-pixels of a first sub-pixel 114*a* and a second sub-pixel 114*b*. Further, one of the sub-pixels of the first sub-pixel 114*a* and the second sub-pixel 114*b* includes a color filter 116. In the example shown in FIG. 8, the second sub-pixel 114*b* includes a second color filter 116*b*, but the first color filter 116*a* does not include a color filter.

The second color filter 116*b* according to the second type of examples may be, for example, a blue color filter used in a color monitor in the related art. As described above, the white light-emitting organic EL element has a chromaticity of yellow due to a change over time. Therefore, by mixing the blue light transmitted through the second color filter 116*b*, it is possible to correct the chromaticity change caused by the change over time of the white light-emitting organic EL element.

In the white light-emitting device 100 according to the second modification example, the area of the sub-pixel (first sub-pixel 114*a*) including the color filter is narrower as compared to the area of the sub-pixel (second sub-pixel 114*b*) not including the color filter. Thus, by relatively increasing the amount of light for white emission rather than the amount of light for correcting chromaticity change, it is possible to improve the overall usage efficiency of the white light-emitting device 100 and suppress power consumption.

FIG. 9 is a diagram showing the optical characteristics of the color filter 116 according to the second modification example in tabular form. In the example shown in FIG. 9, the second color filter 116*b* transmits 100% of the blue light, but blocks the red light and the green light. Therefore, the light usage efficiency of the second color filter 116*b* is 33%. In contrast, the first sub-pixel 114*a* does not include a color filter. That is, it can be said that it has a filter that transmits 100% of each of red light, green light, and blue light. In this case, the light usage efficiency is 100%.

As shown in FIG. 9, in the white light-emitting device 100 according to second modification example, the first sub-pixel 114*a* occupies 80% of the area of the pixel, and the second sub-pixel 114*b* occupies the remaining 20% thereof. Therefore, the overall usage efficiency of the white light-emitting device 100 is 100% (the usage efficiency of the light emitted by the first sub-pixel 114*a*)×0.8 (the area ratio)+33% (the usage efficiency of the light emitted by the second sub-pixel 114*b*)×0.2 (the area ratio)=87%. Thus, it is possible to correct deviation in the chromaticity of the white light emitted by the white light-emitting element, while achieving higher usage efficiency than that of the white light-emitting device 100 according to the example. In addition, when a general-purpose blue filter used in the color monitor in the related art is adopted as the second color filter 116*b*, the cost can be reduced.

Third Modification Example

The above mainly describes when the use of the white light-emitting device 100 is a monitor for medical use. However, the white light-emitting device 100 can also be applied to applications other than the monitor for medical use. For example, our devices may be applied to lighting such as ceiling lights.

The above description has been made about when the white light-emitting device 100 in which each pixel 112 includes two or more sub-pixels 114 and at least one sub-pixel 114 of the two or more sub-pixels 114 includes the color filter 116. The area of each sub-pixel 114 and the type of the color filter 116 are not limited to those described above, and various variations are possible. Hereinafter, these variations will be described as the fourth to ninth modification examples with reference to FIG. 10. In addition, the parts common to modification examples to be described below are appropriately omitted or simplified.

FIGS. 10(*a*) to (*f*) are schematic diagrams showing sub-pixels 114 and color filters 116 according to various modification examples. More specifically, FIG. 10(*a*) is a schematic diagram showing a sub-pixel 114 and a color filter 116 according to a fourth modification example. Further, FIG. 10(*b*) is a schematic diagram showing a sub-pixel 114 and a color filter 116 according to a fifth modification example. The same applies to the following, and FIG. 10(*c*) to FIG. 10(*f*) are schematic diagrams showing sub-pixels 114 and color filters 116 according to a sixth modification example to a ninth modification example, respectively.

Fourth Modification Example

FIG. 10(*a*) is a schematic diagram showing a sub-pixel 114 and a color filter 116 according to a fourth modification example. In the example shown in FIG. 10(*a*), one pixel 112 (not shown in FIG. 10(*a*)) includes two sub-pixels 114, each of which has a first color filter 116*a* and a second color filter 116*b*. In FIG. 10(*a*), a first circle 16*a* and a second circle 16*b* respectively indicate the characteristics of the first color filter 116*a* and the characteristics of the second color filter 116*b*, on the CIE chromaticity diagram.

Specifically, in the example shown in FIG. 10(*a*), the first color filter 116*a* is a color filter that transmits blue light, and the second color filter 116*b* is a color filter that transmits yellow light that is a complementary color of blue. The first sub-pixel 114*a* corresponding to the first color filter 116*a* and the second sub-pixel 114*b* corresponding to the second color filter 116*b* have the same size. Therefore, when light transmitted through the first color filter 116*a* and the light the second color filter 116*b* are synthesized, it becomes white light.

FIG. 10(*a*) shows an example of the first color filter 116*a* transmitting blue light and the second color filter 116*b* transmitting yellow light. However, the light transmitted by the first color filter 116*a* and the light transmitted by the second color filter 116*b* may be in a complementary color relationship, and are not limited to blue and yellow. For example, the light transmitted by the first color filter 116*a* and the light transmitted by the second color filter 116*b* may be red light and cyan light, and green light and magenta light, respectively.

The first color filter 116*a* according to the fourth modification example has a property that the light transmittance is high although the purity of the light transmitted is lower than that of the blue filter used in the color filter in the related art. Thus, the white light-emitting device 100 including the sub-pixel 114 and the color filter 116 according to the fourth modification example can adjust the color of light to be displayed, and can improve the light usage efficiency as compared with the color monitor in the related art.

Fifth Modification Example

FIG. 10(*b*) is a schematic diagram showing a sub-pixel 114 and a color filter 116 according to a fifth modification example. In the example shown in FIG. 10(*b*), one pixel 112 includes a first sub-pixel 114*a*, a second sub-pixel 114*b*, a third sub-pixel 114*c*, and a fourth sub-pixel 114*d*.

In the example shown in FIG. 10(*b*), the first sub-pixel 114*a* does not include a color filter 116, and the second sub-pixel 114*b* to the fourth sub-pixel 114*d* respectively include a first color filter 116*a*, a second color filter 116*b*, and a third color filter 116*c*. In FIG. 10(*b*), a first circle 16*a*, a second circle 16*b*, and a third circle 16*c* respectively indicate the characteristics of the first color filter 116*a*, the characteristics of the second color filter 116*b*, and the characteristics of the third color filter 116*c*, on the CIE chromaticity diagram Specifically, in the example shown in FIG. 10(*b*), the first color filter 116*a* is a color filter that transmits red light, the second color filter 116*b* is a color filter that transmits green light, and the third color filter 116*c* is a color filter that transmits blue light.

In the example shown in FIG. 10(*b*), the light emitting area of the first sub-pixel 114*a* is larger than the light emitting area of each of the second sub-pixel 114*b*, the third sub-pixel 114*c*, and the fourth sub-pixel 114*d*. Further, the light emitting areas of the second sub-pixel 114*b*, the third sub-pixel 114*c*, and the fourth sub-pixel 114*d* are equal to each other. Further, in the example shown in FIG. 10(*b*), a fourth circle 16*d* indicates white in the CIE chromaticity diagram, and it is inside the triangle having the first circle 6*a*, the second circle 16*b*, and the third circle 16*c* as corners.

When the lights transmitted through the first color filter 116*a*, the second color filter 116*b*, and the third color filter 116*c* are synthesized, it becomes white light. Therefore, the lights emitted by the white light-emitting device 100 including the sub-pixel 114 and the color filter 116 according to the fifth modification example are synthesized into white light. Further, the white light-emitting device 100 can adjust the color of the light within the range of the triangle having the first circle 6*a*, the second circle 16*b*, and the third circle 16*c* as corners. Similar to the example shown in FIG. 10(*a*), also in the example shown in FIG. 10(*b*), the transmittance of each color filter 116 is higher than that of the color filter used in the color monitor in the related art. Therefore, the white light-emitting device 100 including the sub-pixel 114 and the color filter 116 according to the fifth modification example can adjust the color of light to be displayed, and can improve the light usage efficiency as compared with the color monitor in the related art.

Sixth Modification Example

FIG. 10(*c*) is a schematic diagram showing a sub-pixel 114 and a color filter 116 according to a sixth modification example. In the example shown in FIG. 10(*c*), one pixel 112 includes a first sub-pixel 114*a*, a second sub-pixel 114*b*, and a third sub-pixel 114*c*.

In the example shown in FIG. 10(*c*), the first sub-pixel 114*a* does not include the color filter 116, and the second sub-pixel 114*b* and the third sub-pixel 114*c* include a first color filter 116*a* and a second color filter 116*b*, respectively. In FIG. 10(*c*), a first circle 16*a* and a second circle 16*b* respectively indicate the characteristics of the first color filter 116*a* and the characteristics of the second color filter 116*b*, on the CIE chromaticity diagram.

As shown in FIG. 10(*c*), the characteristics of the first color filter 116*a* and the second color filter 116*b* are similar to those of the first color filter 116*a* and the second color filter 116*b* shown in FIG. 10(*a*). Therefore, the white light-emitting device 100 including the sub-pixel 114 and the color filter 116 according to the sixth modification example can adjust the color of light to be displayed, and can improve the light usage efficiency as compared with the color monitor in the related art.

Seventh Modification Example

FIG. 10(*d*) is a schematic diagram showing a sub-pixel 114 and a color filter 116 according to a seventh modification example. In the example shown in FIG. 10(*d*), one pixel 112 includes a first sub-pixel 114*a*, a second sub-pixel 114*b*, a third sub-pixel 114*c*, and a fourth sub-pixel 114*d*.

In the example shown in FIG. 10(*d*), the first sub-pixel 114*a* does not include a color filter 116, and the second sub-pixel 114*b* to the fourth sub-pixel 114*d* respectively include a first color filter 116*a*, a second color filter 116*b*, and a third color filter 116*c*. In FIG. 10(*d*), a first circle 16*a*, a second circle 16*b*, and a third circle 16*c* respectively indicate the characteristics of the first color filter 116*a*, the characteristics of the second color filter 116*b*, and the characteristics of the third color filter 116*c*, on the CIE chromaticity diagram Specifically, in the example shown in FIG. 10(*b*), the first color filter 116*a* is a color filter that transmits magenta light, the second color filter 116*b* is a color filter that transmits cyan light, and the third color filter 116*c* is a color filter that transmits blue light. In addition, the fourth circle 15d indicates the characteristics of light emitted by the first sub-pixel 114*a*, and specifically, it indicates white light.

In the example shown in FIG. 10(*d*), the light emitting area of the first sub-pixel 114*a* is wider than the light emitting area of each of the second sub-pixel 114*b*, the third sub-pixel 114*c*, and the fourth sub-pixel 114*d*. In addition, the light emitting area of the second sub-pixel 114*b* and the light emitting area of the third sub-pixel 114*c* are equal to each other, and are narrower than the light emitting area of the fourth sub-pixel 114*d*. As described above, the trajectory drawn by the change over time of the chromaticity of the light emitted by the white light-emitting organic EL element is toward yellow in the CIE chromaticity diagram. Therefore, as shown in FIG. 10(*d*), the white light-emitting device 100 including the sub-pixel 114 and the color filter 116 according to the seventh modification example causes the fourth sub-pixel 114*d* to emit light, thereby correcting the deviation in chromaticity due to change over time of the white light-emitting organic EL element. Further, it is possible to have a width in the chromaticity correction direction, by causing the first sub-pixel 114*a* and the second sub-pixel 114*b* to emit light.

Eighth Modification Example

FIG. 10(*e*) is a schematic diagram showing a sub-pixel 114 and a color filter 116 according to an eighth modification example. In the example shown in FIG. 10(*e*), one pixel 112 includes a first sub-pixel 114*a*, a second sub-pixel 114*b*, and a third sub-pixel 114*c*. In the example shown in FIG. 10(*e*), the light emitting area of the first sub-pixel 114*a* is wider than that of each of the second sub-pixel 114*b* and the third sub-pixel 114*c*. In addition, the light emitting area of the second sub-pixel 114*b* is equal to the light emitting area of the third sub-pixel 114*c*.

In the example shown in FIG. 10(*e*), the first sub-pixel 114*a* does not include the color filter 116, and the second sub-pixel 114*b* and the third sub-pixel 114*c* include a first color filter 116*a* and a second color filter 116*b*, respectively. In FIG. 10(*e*), a first circle 16*a* and a second circle 16*b* respectively indicate the characteristics of the first color filter 116*a* and the characteristics of the second color filter 116*b*, on the CIE chromaticity diagram. In addition, the third circle 16*c* indicates the characteristics of light emitted by the first sub-pixel 114*a*, and specifically, it indicates white light.

As shown in FIG. 10(*e*), the first color filter 116*a* transmits cyan light. On the other hand, the second color filter 116*b* transmits reddish purple light rather than the first color filter 116*a*. The white light-emitting device 100 including the sub-pixel 114 and the color filter 116 according to the eighth modification example can adjust the chromaticity of the light to be emitted within the range of the inside of the triangle whose corners are the first circle 16*a*, the second circle 16*b*, and the third circle 16*c* on the CIE chromaticity diagram shown in FIG. 10(*e*). As described above, the white light-emitting device 100 including the sub-pixel 114 and the color filter 116 according to the eighth modification example is able to have a width in the chromaticity correction direction, similar to the white light-emitting device 100 including the sub-pixel 114 and the color filter 116 according to the seventh modification example.

Ninth Modification Example

FIG. 10(*f*) is a schematic diagram showing a sub-pixel 114 and a color filter 116 according to a ninth modification example. In the example shown in FIG. 10(*f*), one pixel 112 includes a first sub-pixel 114*a*, a second sub-pixel 114*b*, and a third sub-pixel 114*c*. In the example shown in FIG. 10(*e*), the light emitting area of the first sub-pixel 114*a* is wider than that of each of the second sub-pixel 114*b* and the third sub-pixel 114*c*. In addition, the light emitting area of the second sub-pixel 114*b* is equal to the light emitting area of the third sub-pixel 114*c*.

In the example shown in FIG. 10(*f*), the first sub-pixel 114*a* to the third sub-pixel 114*c* have color filters similar to the first color filter 116*a* to the third color filter 116*c* shown in FIG. 10(*b*). In FIG. 10(*f*), a first circle 16*a*, a second circle 16*b*, and a third circle 16*c* respectively indicate the characteristics of the first color filter 116*a*, the characteristics of the second color filter 116*b*, and the characteristics of the third color filter 116*c*, on the CIE chromaticity diagram Accordingly, the white light-emitting device 100 including the sub-pixel 114 and the color filter 116 according to the ninth modification example generates white light as a whole, by suppressing the light emission luminance of the first sub-pixel 114*a* as compared to the second sub-pixel 114*b* and the third sub-pixel 114*c*. On the other hand, when the chromaticity of the white light-emitting organic EL element deviates to the yellow side due to change over time, the light-emission luminance of the first sub-pixel 114*a* is increased. Thus, the white light-emitting device 100 including the sub-pixel 114 and the color filter 116 according to the ninth modification example can adjust the color of light to be displayed.

The invention claimed is:

1. A display device that displays a grayscale image comprising:

two white light-emitting devices used together, each white light-emitting device comprising:

a plurality of pixels; and wherein each of the plurality of pixels includes at least two sub-pixels, each of the sub-pixels being a white light-emitting element, at least one sub-pixel out of the at least two sub-pixels includes a color filter that does not display a color image, an optical characteristic of the color filter is set to correct a deviation in chromaticity of light emitted by the white light-emitting element, wherein the deviation in chromaticity of the white light-emitting element is a deviation in chromaticity due to change over time of the white light-emitting element, and a light emission control unit that controls an emission intensity of each of the white light-emitting elements.

2. The display device according to claim 1, wherein each of the plurality of pixels includes at least three sub-pixels, and the sub-pixels respectively include color filter having optical characteristics different from each other, and the color filter included in each sub-pixel has a transmittance of 50% or more, with respect to at least two light beams out of red light, green light, and blue light.

3. The display device according to claim 1, wherein the color filter has an optical characteristic of transmitting light at a position symmetrical to a point on a trajectory of change over time of the chromaticity of the light emitted by the white light-emitting element is plotted on a Commission Internationale de l'Eclairage (CIE) chromaticity diagram, with respect to white color on the chromaticity diagram.

4. The display device according to claim 1, wherein each of the plurality of pixels includes two sub-pixels, and one sub-pixel out of the two sub-pixels includes a color filter, and an area of the sub-pixel including the color filter is narrower than an area of a sub-pixel not including the color filter.

5. The display device according to claim 1, wherein the optical characteristic of the color filter is set to cancel the deviation between the chromaticity of the light emitted by the white light-emitting element included in the white light-emitting device and the chromaticity of the light emitted by the white light-emitting element included in another white light-emitting device different from the white light-emitting device.

6. The display device according to claim 1, wherein the white light-emitting element is a white light-emitting organic electro-luminescence (EL).

7. The display device according to claim 2, wherein the color filter has an optical characteristic of transmitting light at a position symmetrical to a point on a trajectory of change over time of the chromaticity of the light emitted by the white light-emitting element is plotted on a Commission Internationale de l'Eclairage (CIE) chromaticity diagram, with respect to white color on the chromaticity diagram.

8. The display device according to claim 2, wherein the white light-emitting element is a white light-emitting organic electro-luminescence (EL).

9. The display device according to claim 3, wherein the white light-emitting element is a white light-emitting organic electro-luminescence (EL).

10. The display device according to claim 4, wherein the white light-emitting element is a white light-emitting organic electro-luminescence (EL).

11. The display device according to claim 5, wherein the white light-emitting element is a white light-emitting organic electro-luminescence (EL).

* * * * *